United States Patent
Watabe et al.

(10) Patent No.: US 11,804,560 B2
(45) Date of Patent: Oct. 31, 2023

(54) SOLAR CELL AND METHOD FOR MANUFACTURING THE SAME

(71) Applicant: SHIN-ETSU CHEMICAL CO., LTD., Tokyo (JP)

(72) Inventors: Takenori Watabe, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 59 days.

(21) Appl. No.: 16/307,173

(22) PCT Filed: Apr. 7, 2017

(86) PCT No.: PCT/JP2017/014521
§ 371 (c)(1),
(2) Date: Dec. 5, 2018

(87) PCT Pub. No.: WO2017/217089
PCT Pub. Date: Dec. 21, 2017

(65) Prior Publication Data
US 2019/0131471 A1     May 2, 2019

(30) Foreign Application Priority Data

Jun. 13, 2016 (JP) ................. 2016-116979

(51) Int. Cl.
*H01L 31/0224* (2006.01)
*H01L 31/18* (2006.01)
*H01L 31/068* (2012.01)

(52) U.S. Cl.
CPC .... *H01L 31/022458* (2013.01); *H01L 31/068* (2013.01); *H01L 31/18* (2013.01); *Y02E 10/50* (2013.01); *Y02P 70/50* (2015.11)

(58) Field of Classification Search
CPC .......... H01L 31/022458; H01L 31/068; H01L 31/0682; H01L 31/022441; H01L 31/18
See application file for complete search history.

(56) References Cited

U.S. PATENT DOCUMENTS 8,691,677 B2 * 4/2014 Pellegrin ............. H01L 21/2255
438/565
2007/0031986 A1   2/2007 Nishimoto
(Continued)

FOREIGN PATENT DOCUMENTS

CN   101383386 A * 3/2009 ..... H01L 31/022458
CN   102800740 A   11/2012
(Continued)

OTHER PUBLICATIONS

Partial translation of Wang CN 101383386 A (Year: 2020).*
(Continued)

*Primary Examiner* — Tamir Ayad
(74) *Attorney, Agent, or Firm* — Oliff PLC

(57) ABSTRACT

A solar cell including: a semiconductor substrate having a first conductivity type; a first conductivity type layer having a conductivity type equal to the first conductivity type and a second conductivity type layer having a second conductivity type opposite to the first conductivity type, which are located on a first main surface of the substrate; a first collecting electrode on the first conductivity type layer located on the first main surface; and a second collecting electrode on the second conductivity type layer located on the first main surface. In the solar cell, a second conductivity type layer having the second conductivity type is formed on a side surface of the semiconductor substrate and continuously from the second conductivity type layer located on the first main surface. Consequently, it is possible to provide a (Continued)

solar cell having excellent conversion efficiency and being capable of efficiently collecting carriers.

10 Claims, 6 Drawing Sheets

(56) References Cited

U.S. PATENT DOCUMENTS

| | | | |
|---|---|---|---|
| 2010/0294333 | A1 | 11/2010 | Wang et al. |
| 2011/0120518 | A1* | 5/2011 | Rust .................... H01L 31/0516 |
| | | | 136/244 |
| 2012/0298192 | A1* | 11/2012 | Zhang ............. H01L 31/022441 |
| | | | 257/E31.13 |
| 2013/0247980 | A1 | 9/2013 | Yokosawa et al. |
| 2015/0243806 | A1* | 8/2015 | Hu .................... H01L 31/02168 |
| | | | 438/71 |
| 2016/0315210 | A1 | 10/2016 | Kubo et al. |

FOREIGN PATENT DOCUMENTS

| | | |
|---|---|---|
| CN | 103811591 A | 5/2014 |
| JP | 2007-042940 A | 2/2007 |
| JP | 2012-124193 A | 6/2012 |
| JP | 2013-069760 A | 4/2013 |
| JP | 2014-003340 A | 1/2014 |
| JP | 2015-005718 A | 1/2015 |
| TW | 201511319 A | 3/2015 |

OTHER PUBLICATIONS

Nov. 12, 2019 Extended Search Report issued in European Patent Application No. 17812995.3.
Aug. 13, 2019 Office Action issued in Japanese Patent Application No. 2018-523344.
Dec. 18, 2018 International Preliminary Report on Patentability issued in International Patent Application No. PCT/JP2017/014521.
Jun. 6, 2017 Search Report issued in International Patent Application No. PCT/JP2017/014521.
Jul. 15, 2020 Office Action issued in Taiwanese Patent Application No. 106119483.
Oct. 12, 2020 Office Action issued in Indonesian Patent Application No. P00201810284.
Aug. 26, 2021 Office Action issued in Chinese Patent Application No. 201780036800.0.
Oct. 28, 2021 Office Action issued in Indian Patent Application No. 201847046752.
Sep. 27, 2021 Office Action issued in Vietnamese Patent Application No. 1-2018-05593.
Apr. 20, 2022 Search Report issued in Chinese Patent Application No. 201780036800.0.

* cited by examiner

FIG.2
(a)
(b)
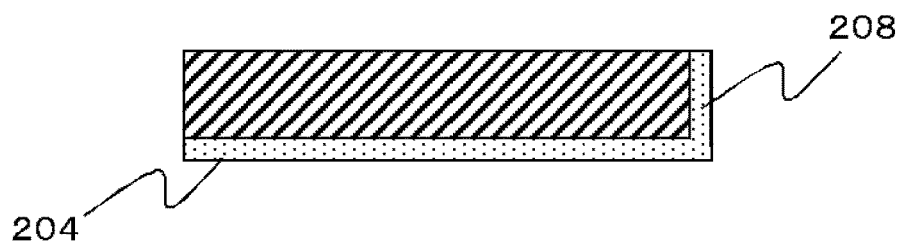
(c)
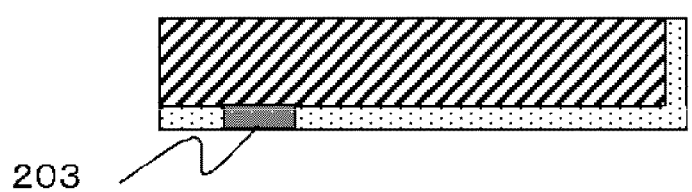
(d)
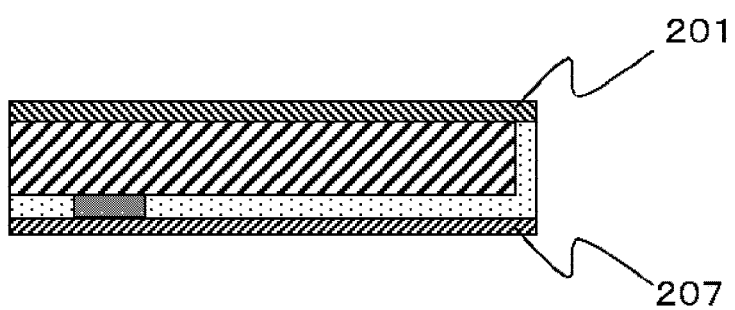
(e)
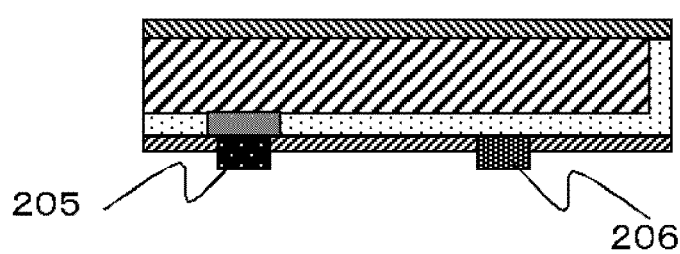

SOLAR CELL AND METHOD FOR MANUFACTURING THE SAME

TECHNICAL FIELD

The present invention relates to a solar cell and a method for manufacturing the solar cell.

BACKGROUND ART

As one of structures of a solar cell having relatively high photoelectric conversion efficiency using a single-crystal or polycrystalline semiconductor substrate, there is a back surface electrode type solar cell in which all of positive and negative electrodes are provided on a non-light receiving surface (back surface). First, an overview of such a back surface is shown in FIG. 6. On the back surface of a solar cell, a back-surface emitter layer 604 and base layers 603 are alternately arranged. Moreover, emitter electrodes 606, 616 are provided as collecting electrodes on and along the back-surface emitter layer 604, and base electrodes 605, 615 are provided as collecting electrodes on and along the base layers 603. Typically, the back-surface emitter layer 604 has a width of approximately several mm to several hundred μm, and the base layer 603 has a width of approximately several hundred μm to several ten μm. Further, among the collecting electrodes, the emitter electrode 606 and the base electrode 605 typically have electrode widths of approximately several hundred to several ten μm, and these electrodes are often referred to as finger electrodes. Meanwhile, the emitter electrode 616 and the base electrode 615 typically have electrode widths of approximately several mm to several hundred μm, and these electrodes are often referred to as bus bar electrodes. Note that, in this description, the term collecting electrode means an electrode configured to extract carriers generated in a substrate, and is a concept including a finger electrode and a bus bar electrode.

Next, FIG. 7 shows a schematic view of a cross-sectional structure. A solar cell 700 includes a semiconductor substrate 702. In the vicinity of an outermost layer of a back surface of the semiconductor substrate 702, a back-surface emitter layer 704 and base layers 703 are formed. Each layer has a thickness of at most approximately 1 μm. An emitter electrode (finger electrode) 706 is provided on the back-surface emitter layer 704, and a base electrode (finger electrode) 705 is provided on the base layer 703. In addition, the surface of a non-electrode region is covered with a back-surface protective coat 707 such as a SiNx film and a silicon oxide film. An antireflection film 701 is provided on a light receiving surface side for the purpose of reducing reflectance loss.

CITATION LIST

Patent Literature

Patent Literature 1: Japanese Unexamined Patent Application Publication No. 2012-124193

SUMMARY OF INVENTION

Technical Problem

Back surface electrode type solar cells having high photoelectric conversion efficiency are demanded. The photoelectric conversion efficiency of such a solar cell provided with an emitter layer on the back surface side strongly depends on the lifetime of minority carriers in a substrate. Since most of incident light is absorbed near the top surface layer of the substrate, a lot of carriers are generated in the vicinity of the top surface layer of the substrate. For the power generation, the emitter layer needs to collect the generated carriers. Nevertheless, if the lifetime is short, the carriers recombine before reaching the emitter layer. Thus, it is essential to keep the lifetime long to achieve high photoelectric conversion efficiency.

An example of back surface electrode type solar cells includes Patent Literature 1, for example. Patent Literature 1 is to enhance the conversion efficiency by suppressing the recombination at the light receiving surface and improving the effective lifetime. This technique improves the conversion efficiency, but is unfavorable for practical use because a large number of manufacturing steps are required for the improvement.

The present invention has been made in view of the above problems. An object of the present invention is to provide a solar cell having excellent conversion efficiency and being capable of efficiently collecting carriers. Another object is to provide a method for manufacturing a solar cell by which such a solar cell can be manufactured easily.

Solution to Problem

To achieve the object, the present invention provides a solar cell comprising:
- a semiconductor substrate having a first conductivity type;
- a first conductivity type layer having a conductivity type equal to the first conductivity type and a second conductivity type layer having a second conductivity type opposite to the first conductivity type, which are located on a first main surface of the substrate;
- a first collecting electrode on the first conductivity type layer located on the first main surface; and
- a second collecting electrode on the second conductivity type layer located on the first main surface, wherein
- a second conductivity type layer having the second conductivity type is formed on a side surface of the semiconductor substrate and continuously from the second conductivity type layer located on the first main surface.

In such a solar cell, the second conductivity type layers are continuously formed from the first main surface over the side surface. This makes it possible to efficiently collect carriers generated particularly in an outer peripheral portion of the substrate. Thereby, the conversion efficiency is enhanced. Note that, hereinbelow, the first main surface is also referred to as a back surface; the second main surface is also referred to as a light receiving surface; the first conductivity type layer is also referred to as a base layer; the second conductivity type layer is also referred to as an emitter layer; the first collecting electrode is also referred to as a base electrode; the second collecting electrode is also referred to as an emitter electrode.

In addition, a second conductivity type layer having the second conductivity type is preferably formed on an outer peripheral portion of a second main surface of the semiconductor substrate and continuously from the second conductivity type layer located on the first main surface via the side surface of the semiconductor substrate.

A solar cell including such second conductivity type layers formed continuously from the first main surface to the outer peripheral portion of the second main surface via the side surface makes it possible to further enhance the efficiency of collecting carriers into the emitter layers. Particularly, carriers generated from the outer peripheral portion of the top surface layer of the substrate can be collected more efficiently.

Moreover, an electrode located closest to an outermost peripheral end of the first main surface is preferably the second collecting electrode.

In such a solar cell, the distances from the emitter electrode to the emitter layer located on the side surface and to the emitter layer located on the second main surface are short. Hence, it is less likely that the solar cell is influenced by emitter-traverse flow resistance (which is resistance encountered when carriers collected in the emitter layer flow toward the electrode in the emitter layer).

Further, the present invention provides a method for manufacturing a solar cell, comprising the steps of:
  forming a second conductivity type layer on a first main surface of a semiconductor substrate having a first conductivity type, the second conductivity type layer having a second conductivity type opposite to the first conductivity type;
  forming a first conductivity type layer having a conductivity type equal to the first conductivity type on the first main surface;
  forming a first collecting electrode on the first conductivity type layer located on the first main surface; and
  forming a second collecting electrode on the second conductivity type layer located on the first main surface, wherein
  in the step of forming the second conductivity type layer having the second conductivity type, a second conductivity type layer having the second conductivity type is formed on a side surface of the semiconductor substrate and continuously from the second conductivity type layer located on the first main surface to thereby manufacture a solar cell in which the second conductivity type layers having the second conductivity type are continuously formed from the first main surface over the side surface.

Such a method for manufacturing a solar cell makes it possible to easily manufacture a solar cell having excellent conversion efficiency and being capable of efficiently collecting carriers.

Moreover, in the step of forming the second conductivity type layer having the second conductivity type, the second conductivity type layer located on the first main surface and the second conductivity type layer located on the side surface may be formed by a coating-diffusion treatment, and the coating-diffusion treatment involves a single coating step and a single diffusion heating step.

Such a method for manufacturing a solar cell can easily form the second conductivity type layers on the first main surface and the side surface. Additionally, by controlling the condition during the coating-diffusion treatment, a desired second conductivity type layer(s) can be easily formed on the first main surface and the side surface.

Moreover, in the step of forming the second conductivity type layer having the second conductivity type, the second conductivity type layer located on the first main surface and the second conductivity type layer located on the side surface may be formed by a vapor phase diffusion heating treatment while two semiconductor substrates having the first conductivity type are stacked.

Such a method for manufacturing a solar cell can easily form the second conductivity type layers on the first main surface and the side surface. In addition, by controlling the condition during the vapor phase diffusion heating treatment, a desired second conductivity type layer(s) can be easily formed on the first main surface and the side surface.

Furthermore, the present invention provides a solar cell manufacturing system comprising:
  an apparatus configured to form a second conductivity type layer on a first main surface of a semiconductor substrate having a first conductivity type, the second conductivity type layer having a second conductivity type opposite to the first conductivity type;
  an apparatus configured to form a first conductivity type layer having a conductivity type equal to the first conductivity type on the first main surface;
  an apparatus configured to form a first collecting electrode on the first conductivity type layer located on the first main surface; and
  an apparatus configured to form a second collecting electrode on the second conductivity type layer located on the first main surface, wherein
  in the apparatus configured to form the second conductivity type layer having the second conductivity type, a second conductivity type layer having the second conductivity type is formed on a side surface of the semiconductor substrate and continuously from the second conductivity type layer located on the first main surface to thereby manufacture a solar cell in which the second conductivity type layers having the second conductivity type are continuously formed from the first main surface over the side surface.

Such a solar cell manufacturing system is a system capable of easily manufacturing a solar cell having excellent conversion efficiency and being capable of efficiently collecting carriers.

Moreover, in the apparatus configured to form the second conductivity type layer having the second conductivity type, the second conductivity type layer located on the first main surface and the second conductivity type layer located on the side surface may be formed by a coating-diffusion treatment, and the coating-diffusion treatment involves a single coating step and a single diffusion heating step.

Such a solar cell manufacturing system can easily form the second conductivity type layers on the first main surface and the side surface. Additionally, by controlling the condition during the coating-diffusion treatment, a desired second conductivity type layer(s) can be easily formed on the first main surface and the side surface.

Moreover, in the apparatus configured to form the second conductivity type layer having the second conductivity type, the second conductivity type layer located on the first main surface and the second conductivity type layer located on the side surface may be formed by a vapor phase diffusion heating treatment while two semiconductor substrates having the first conductivity type are stacked.

Such a solar cell manufacturing system can easily form the second conductivity type layers on the first main surface and the side surface. In addition, by controlling the condition during the vapor phase diffusion heating treatment, a desired second conductivity type layer(s) can be easily formed on the first main surface and the side surface.

Advantageous Effects of Invention

According to the present invention, the back surface electrode type solar cell is provided with the emitter layer on the side surface of the substrate, preferably from the side surface of the substrate to the outer peripheral portion of the light receiving surface. Thereby, the efficiency of collecting carriers at the outer peripheral portion of the substrate is improved without increasing the emitter-traverse flow resistance, and the conversion efficiency is enhanced. In addition, this structure can be easily produced by employing the coating diffusion method or the vapor phase diffusion method.

BRIEF DESCRIPTION OF DRAWINGS

FIG. 2 shows flow diagrams for illustrating an example of a method for manufacturing a solar cell of the present invention.

DESCRIPTION OF EMBODIMENTS

Figure 1:
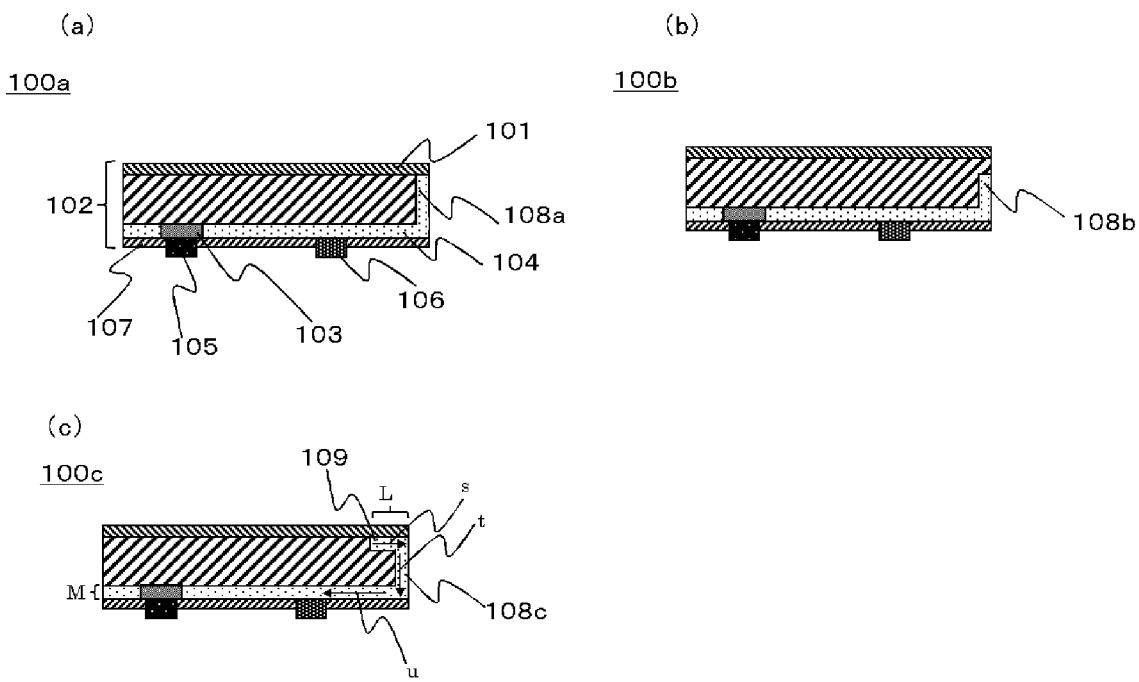
FIG. 1 shows schematic cross-sectional views for illustrating an example of a solar cell of the present invention.

Hereinafter, the present invention will be described in more details.

As described above, a solar cell having excellent conversion efficiency and being capable of efficiently collecting carriers has been demanded.

The present inventors have earnestly studied to achieve the above-described objects. As a result, the inventors have found that the demand can be satisfied by a solar cell including second conductivity type layers formed continuously from the first main surface over a side surface, thereby bringing the present invention to completion.

In the following detailed description, to understand the overall invention and show how the invention is carried out in a given specific example, many given details will be explained. However, it can be understood that the present invention can be carried out without these given details. To avoid obscureness of the present invention, a known method, a procedure, and technologies will not be described in detail hereinafter. Although a given specific example of the present invention will be described with reference to given drawings, the present invention is not restricted thereto. The drawings described herein are schematic, and do not restrict the scope of the present invention. Further, in the drawings, for the purpose of illustration, sizes of several elements are exaggerated, and hence the scale may not be correct.

[Solar Cell]

Hereinafter, a solar cell of the present invention will be described with reference to the drawings, but the present invention is not limited thereto.

FIGS. 1(a) to (c) are schematic cross-sectional views for illustrating an example of the inventive solar cell. Note that, in FIGS. 1(a) to (c) and FIG. 2 to be described later, peripheral edge portions of substrates are enlarged, and central portions of the substrates are omitted. First, as shown in FIG. 1(a), the inventive solar cell 100a includes a semiconductor substrate 102 having a first conductivity type. Moreover, a first conductivity type layer (base layer) 103 having a conductivity type equal to the first conductivity type and a second conductivity type layer (back-surface emitter layer) 104 having a second conductivity type opposite to the first conductivity type are provided on a first main surface of the semiconductor substrate 102. Further, the inventive solar cell 100a includes a first collecting electrode (base electrode) 105 on the first conductivity type layer 103 located on the first main surface, and a second collecting electrode (emitter electrode) 106 on the second conductivity type layer 104 located on the first main surface. Furthermore, on a side surface of the semiconductor substrate 102, a second conductivity type layer (side-surface emitter layer) 108a having the second conductivity type is formed continuously from the second conductivity type layer 104 located on the first main surface. Additionally, an antireflection film 101 is provided on a second main surface in many cases. In addition, a back-surface protective coat 107 is provided on the first main surface in many cases.

Figure 7:
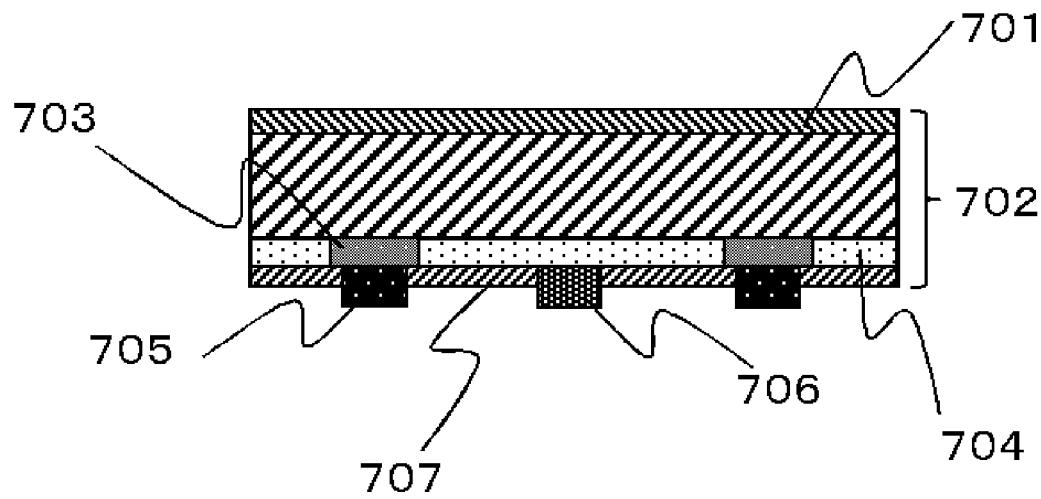
FIG. 7 is a schematic cross-sectional view for illustrating a typical back surface electrode type solar cell.

To put it differently, in the inventive solar cell, the central portion of the substrate may be the same as that of a conventional substrate (FIG. 7). Nevertheless, the emitter layer 108a is formed on the side surface of the substrate. Moreover, in the present invention, the side-surface emitter layer needs to be continuous from the emitter layer 104 on the back surface. Such a structure makes it possible to efficiently collect carriers generated in an outer peripheral portion of the substrate. Further, the range of the increasing emitter region can be confined, so that the series resistance hardly increases. As a result, the photoelectric conversion efficiency is enhanced as compared to the conventional photoelectric conversion efficiency. Thus, the inventive solar cell has high output.

Additionally, this emitter layer on the side surface of the substrate, like a side-surface emitter layer 108b in a solar cell 100b shown in FIG. 1(b), does not have to reach the light receiving surface completely.

Meanwhile, as in a solar cell 100c shown in FIG. 1(c), a second conductivity type layer 109 having the second conductivity type may be formed on an outer peripheral portion of the second main surface of the semiconductor substrate and continuously from the second conductivity type layer located on the first main surface via a second conductivity type layer 108c located on the side surface of the semiconductor substrate. To put it differently, the emitter layer may be formed somewhat at the light receiving surface side. In this manner, providing an emitter layer also on the outer peripheral portion of the light receiving surface makes it possible to further enhance the efficiency of collecting carriers into the emitter layers. Particularly, carriers generated in the outer peripheral portion of the top surface layer of the substrate can be efficiently collected. In this case, the emitter layer on the light receiving surface preferably has a width L of 1.5 mm or less from an outermost peripheral end of the substrate. With this range, a higher effect of improving the photoelectric conversion efficiency is obtained. In other words, when the emitter layer on the light receiving surface has a width of 1.5 mm or less, there is little influence from the emitter-traverse flow resistance (resistance when carriers flow from s to u in FIG. 1(c)), and the conversion efficiency is hardly decreased. In this case, the lower limit of the width L of the emitter layer can be, for example, 0 mm. Note that, from the viewpoint of enhancing the efficiency of collecting carriers, it is conceivable that the emitter layer is provided on the entire light receiving surface. In this case, however, the emitter-traverse flow resistance is increased, so that the conversion efficiency is consequently decreased. Thus, when the light-receiving-surface emitter layer is provided, the light-receiving-surface emitter layer is provided on the outer peripheral portion of the light receiving surface. Note that each emitter layer and base layer can have a thickness (diffusion depth) M of, for example, approximately 0.05 to 1 μm.

Additionally, an electrode located closest to the outermost peripheral end of the first main surface (hereinafter, also referred to as back-surface outermost peripheral electrode) is preferably the second collecting electrode. In other words, the back-surface outermost peripheral electrode is preferably connected to the emitter layer. Thereby, the distance between the side-surface emitter layer and the emitter electrode is shortened. Hence, there is little influence from an increase in the series resistance due to the emitter-traverse flow, and the effect of improving the conversion efficiency is also increased. Such electrode arrangement is more preferable particularly when the light-receiving-surface emitter layer is formed. Thereby, the distance between the light-receiving-surface emitter layer and the back-surface emitter electrode is shortened, making it possible to more surely prevent a problem that the conversion efficiency is consequently decreased due to an increase in the emitter-traverse flow resistance.

Figure 3:
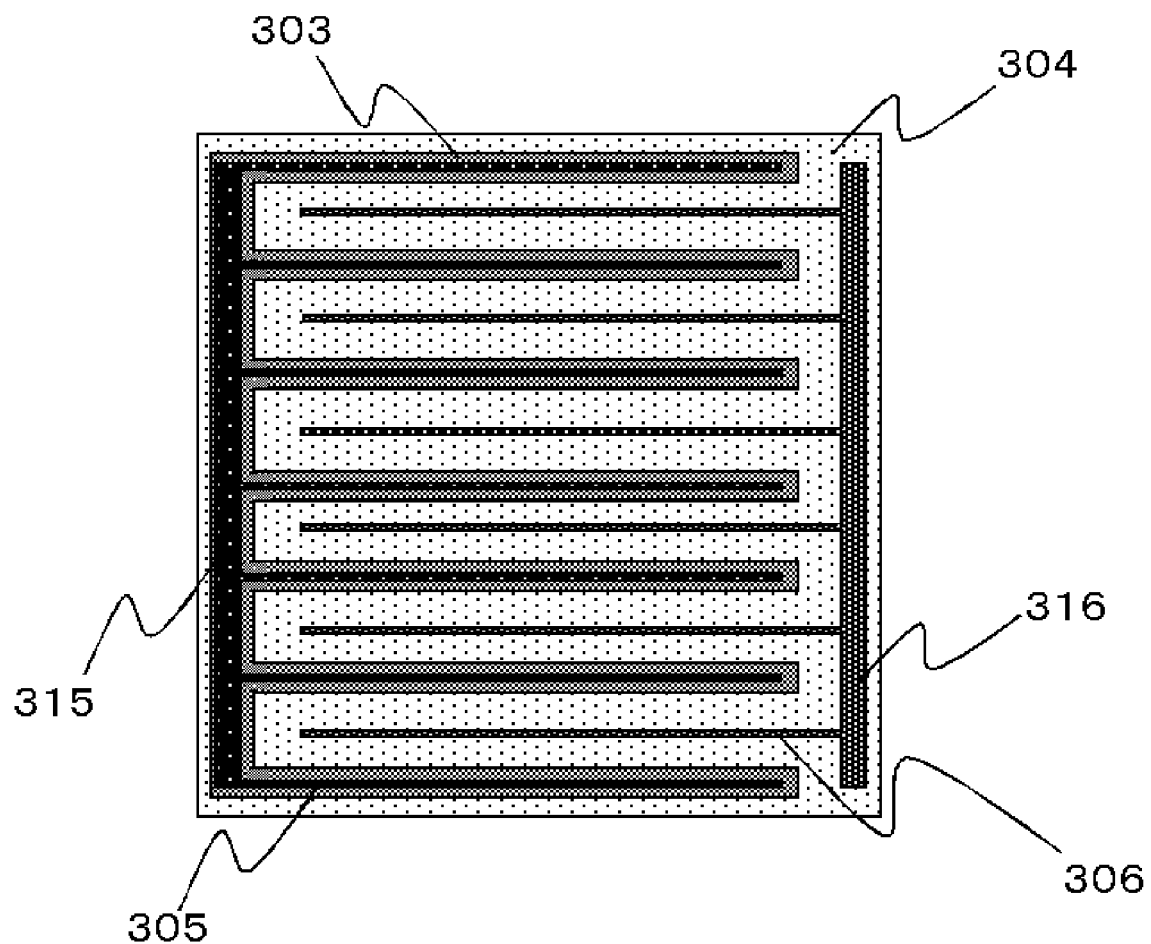
FIG. 3 is a schematic top view for illustrating an example of an overview of a first main surface of the inventive solar cell.
Figure 4:
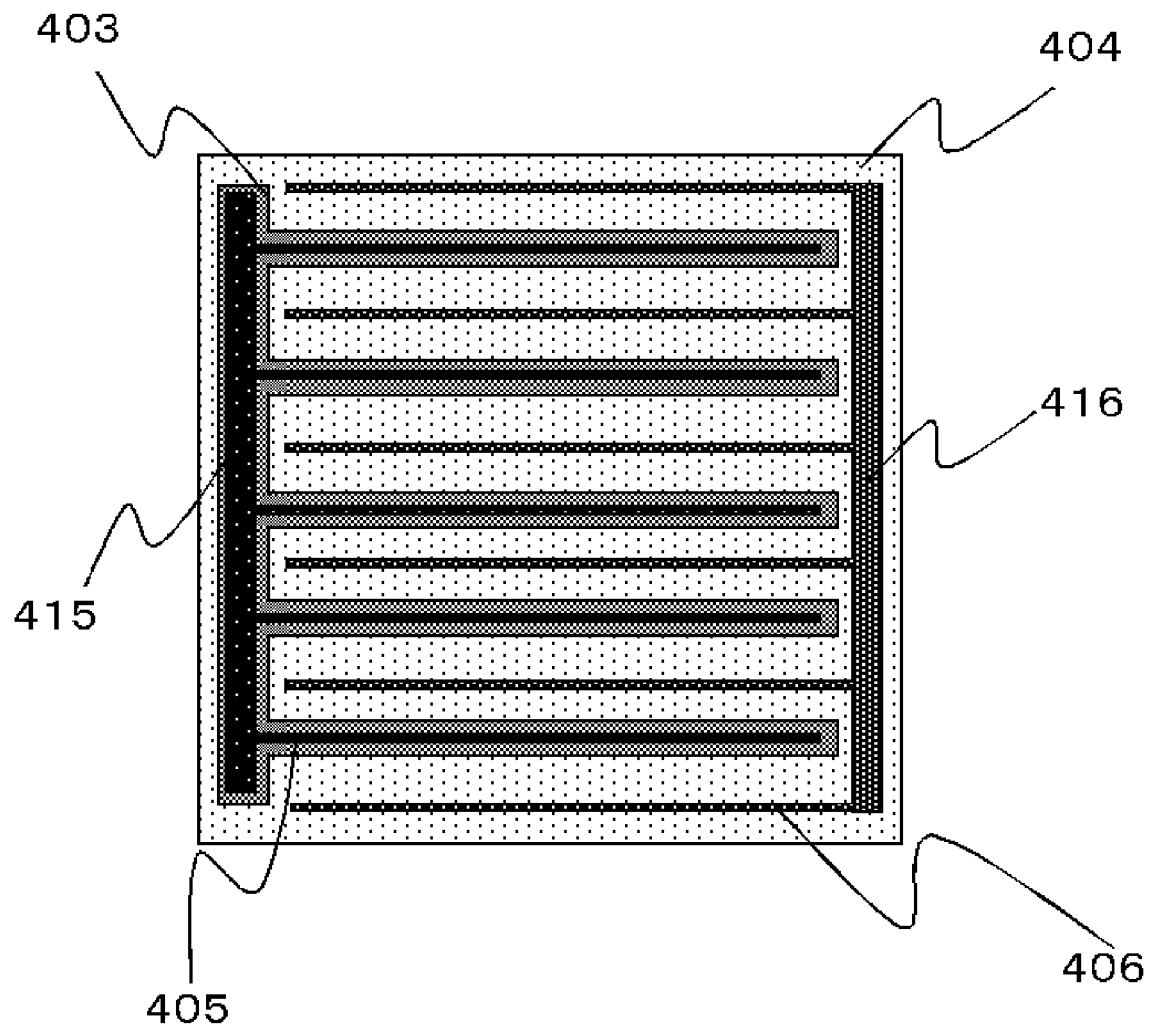
FIG. 4 is a schematic top view for illustrating another example of the overview of the first main surface of the inventive solar cell.
Figure 5:
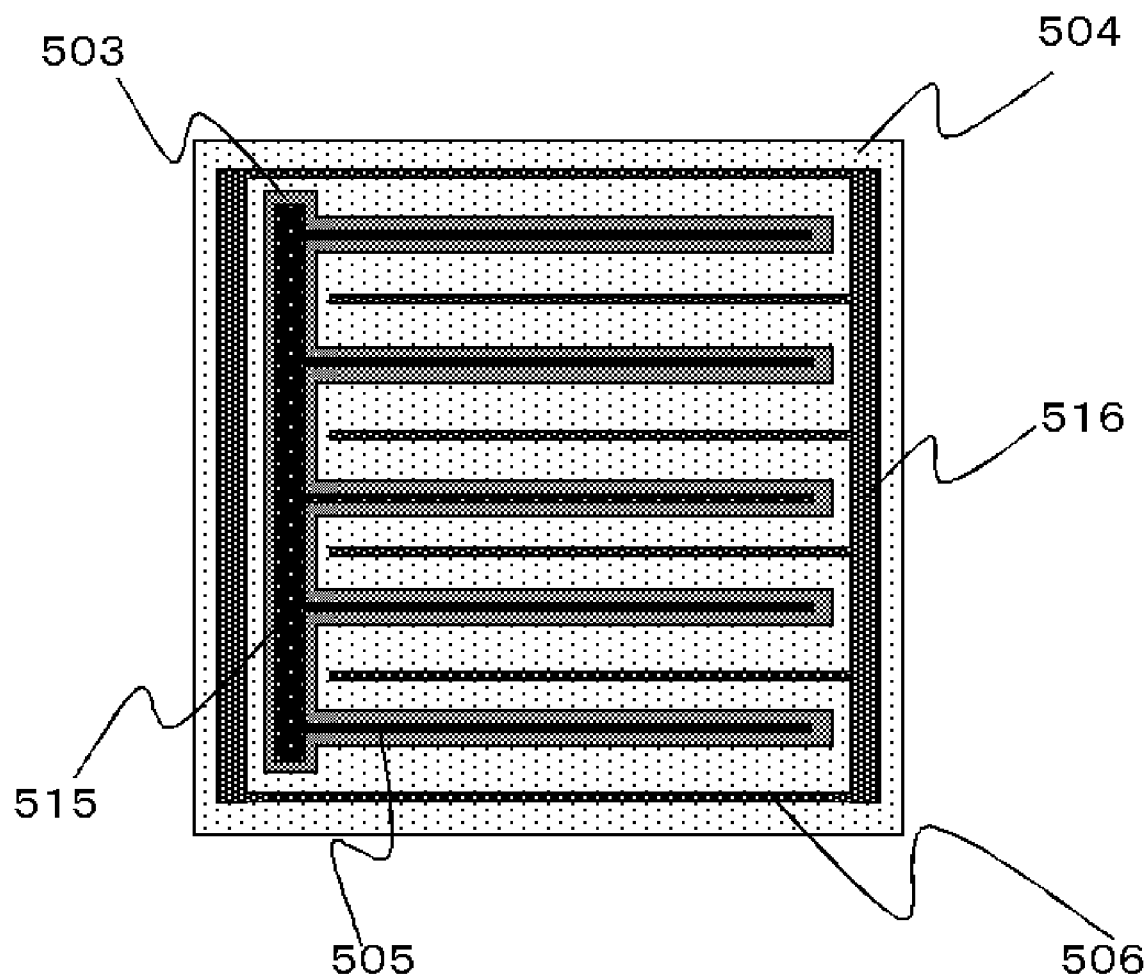
FIG. 5 is a schematic top view for illustrating another example of the overview of the first main surface of the inventive solar cell.
Figure 6:
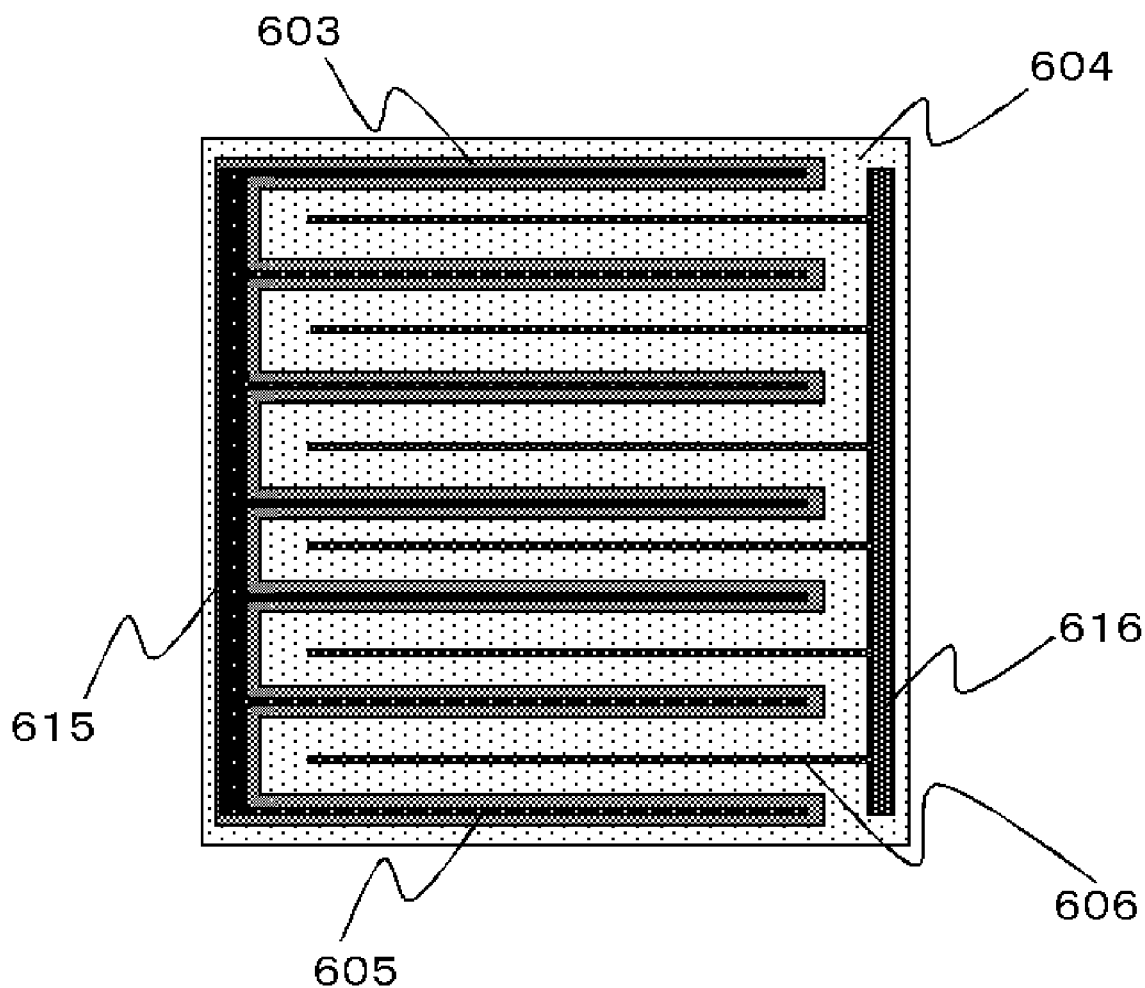
FIG. 6 is a schematic top view for illustrating an overview of a back surface of a typical back surface electrode type solar cell.

Specific examples of the overview of the back surface in this case include structures shown in FIGS. 3 to 5. In any of back surface electrode type solar cells shown in FIGS. 3 to 5, positive and negative collecting electrodes (emitter electrodes and base electrodes) are formed on the back surface of the square semiconductor substrate. In addition, each group of the emitter electrodes and the base electrodes includes finger electrodes and a bus bar electrode formed at a position substantially orthogonal to the finger electrodes.

First, as shown in FIG. 3, the back-surface outermost peripheral electrode may be an emitter electrode (bus bar electrode) 316 on a back-surface emitter layer 304, which is located at only one side of the square semiconductor substrate. In this case, at the remaining three sides, the back-surface outermost peripheral electrodes are base electrodes 305, 315 on a base layer 303. In addition, emitter electrodes (finger electrodes) 306 are formed inward of the base electrodes 305.

Moreover, as shown in FIG. 4, the back-surface outermost peripheral electrode may be emitter electrodes 406, 416 on a back-surface emitter layer 404, which are located at three sides of the square semiconductor substrate. In this case, the back-surface outermost peripheral electrode at the remaining one side is a base electrode (bus bar electrode) 415 on a base layer 403. In addition, base electrodes (finger electrodes) 405 are formed inward of the emitter electrodes 406.

Further, as shown in FIG. 5, the back-surface outermost peripheral electrode may be emitter electrodes 506, 516 on a back-surface emitter layer 504, which are located at four sides of the square semiconductor substrate. In this case, base electrodes 505, 515 on a base layer 503 are formed inward of the emitter electrodes 506, 516. Such effects as the effect of reducing the emitter-traverse flow resistance are the largest when four sides are surrounded as in FIG. 5 among FIG. 3 to FIG. 5. Nevertheless, even when the back-surface outermost peripheral electrode at only one side is an emitter electrode as in FIG. 3, the effects are still obtained to some extents. The larger the number of sides where the back-surface outermost peripheral electrodes are emitter electrodes, the larger the effect.

[Method for Manufacturing Solar Cell]

Hereinafter, an example of a method for manufacturing a solar cell of the present invention will be described with reference to FIG. 2 by taking an example where the semiconductor substrate having the first conductivity type is an N-type silicon substrate. Nevertheless, the present invention is not limited thereto.

FIG. 2 shows flow diagrams for illustrating an example of the inventive method for manufacturing a solar cell. First, referring to FIG. 2(*a*), high-purity silicon is doped with a pentad such as phosphorus, arsenic, or antimony. Slice damage on the surface of an as-cut single-crystal {100} N-type silicon substrate 202 having a specific resistance of 0.1 to 5 Ω·cm is subjected to etching by using a high concentration alkali such as sodium hydroxide or potassium hydroxide at a concentration of 5 to 60%, a mixed acid of hydrofluoric acid and nitric acid, or the like. The single-crystal silicon substrate may be prepared by any method of the CZ method and the FZ method. The substrate does not necessarily have to be single-crystal silicon, and may be polycrystalline silicon.

Subsequently, fine irregularities called texture are formed on the substrate surface. Texturing is an effective method for reducing the reflectance of a solar cell. The texture is prepared by immersion in a heated solution of alkali such as sodium hydroxide, potassium hydroxide, potassium carbonate, sodium carbonate, or sodium hydrogencarbonate (concentration: 1 to 10%, temperature: 60 to 100° C.) for approximately 10 minutes to 30 minutes. A certain amount of 2-propanol may be dissolved in the solution to promote the reaction.

After the texture formation, the substrate is cleaned in an acidic aqueous solution of, for example, hydrochloric acid, sulfuric acid, nitric acid, hydrofluoric acid, or a mixture thereof. Hydrogen peroxide water may be mixed with any of these acidic solutions and then heated. This case is preferable because the cleanliness is enhanced.

Next, as shown in FIG. 2(*b*), a second conductivity type layer (back-surface emitter layer) 204 having the second conductivity type opposite to the first conductivity type is formed on the first main surface of the semiconductor substrate (N-type silicon substrate) 202 having the first conductivity type. In the present invention, in this step, a second conductivity type layer (side-surface emitter layer) 208 having the second conductivity type is formed on the side surface of the semiconductor substrate 202 continuously from the second conductivity type layer 204 located on the first main surface. In this event, an emitter layer may be formed continuously from the back surface of the substrate to the outer peripheral portion of the light receiving surface via the side surface in the present invention.

These second conductivity type layers have a conductivity type (in this example, P type) which is opposite to that of the substrate. Each of the second conductivity type layers normally has a thickness of approximately 0.05 to 1 μm.

According to the present invention, in the step of FIG. 2(*b*), the second conductivity type layer 204 located on the first main surface and the second conductivity type layer 208 located on the side surface can be formed by a coating-diffusion treatment, the coating-diffusion treatment involving a single coating step and a single diffusion heating step. In other words, these second conductivity type layers (emitter layers) can be formed by a single coating treatment and a single diffusion heating treatment. For example, these second conductivity type layers can be formed by a method including applying a coating agent containing a boron source to the entire first main surface, followed by heating at 950 to 1050° C. Specifically, an aqueous solution containing 1 to 4% of boric acid as the boron source and 0.1 to 4% of polyvinyl alcohol as a thickener is prepared in advance, and the entire first main surface is spin-coated with this solution. Although depending on the viscosity of the coating agent, the number of rotations in the spin-coating is preferably 800 to 2500 rotations per minute. Note that, in this case, the coating agent preferably has a viscosity of approximately 40 to 140 mPa·s. By the coating under these conditions, the coating agent can be spread to the outer peripheral portion of the first main surface within a range of approximately 1 mm from the side surface of the substrate. This coating agent eventually becomes the emitter layer 208 on the substrate side surface and the emitter layer on the outer peripheral portion of the light receiving surface (the emitter layer 109 on the light receiving surface in FIG. 1(c)), contributing to the enhancement of the photoelectric conversion efficiency. Note that, as shown in FIG. 2(b), the side-surface emitter layer 208 can be formed without forming the light-receiving-surface emitter layer by controlling the number of rotations in the spin-coating.

Alternatively, according to the present invention, in the step of FIG. 2(b), the second conductivity type layer 204 located on the first main surface and the second conductivity type layer 208 located on the side surface can also be formed by a vapor phase diffusion heating treatment while two semiconductor substrates 202 having the first conductivity type are stacked. In this case, these second conductivity type layers (emitter layers) can be formed by vapor-phase diffusion using $BBr_3$ or the like. In this method, two substrates are placed as one set in a heat treatment furnace such that light receiving surfaces of the substrates are stacked on each other. A gas mixture of $BBr_3$ and oxygen is introduced thereto, followed by heating at 950 to 1050° C. Nitrogen and argon are suitable as the carrier gas. Since the treatments are performed while the two substrates are stacked, boron diffusion layers (emitter layers) are formed on all of the back surfaces located on the outer sides and the side surfaces of the substrates, but no such diffusion layer is formed on the stacked surfaces (the light receiving surfaces located on the inner side); otherwise, if a diffusion layer is formed by chance, the length is approximately 1 mm from the outer periphery. Consequently, the emitter layer 208 can be formed on the substrate side surface, and an emitter layer on the outer peripheral portion of the light receiving surface can also be formed as necessary.

Next, as shown in FIG. 2(c), a first conductivity type layer (base layer) 203 having a conductivity type equal to the first conductivity type is formed on the first main surface. This step can be performed by the method shown below, for example. First, a mask for forming the base layer is formed on both the main surfaces. As the mask, a silicon oxide film, a SiNx film, or the like can be used. By employing a chemical vapor deposition (CVD) method, any of the films can be formed by appropriately selecting the type of gas to be introduced. A silicon oxide film can be formed by thermally oxidizing the substrate. The substrate is heated in an oxygen atmosphere at 950 to 1100° C. for 30 minutes to 4 hours, so that a thermally oxidized silicon film of approximately 100 nm is formed. This heat treatment may be performed after the above-described heat treatment for forming the emitter layer in the same batch. Then, the mask is opened at a part which is to be the base layer. Specifically, openings can be formed as parallel lines with opening widths of 50 to 400 μm at intervals of approximately 0.6 to 2.0 mm. A photolithography method can be employed for the opening, while opening by using an etching paste or a laser is easy and preferable. Once the mask is opened, the substrate is immersed in an alkali aqueous solution such as KOH or NaOH heated to 50 to 90° C., so that an unnecessary emitter layer at the opening parts is removed (etched). Note that, in this event of removing the emitter layer, the substrate is recessed slightly (for example, approximately 5 μm), but the resulting irregularity does not influence the solar cell characteristics and is negligible. For this reason, the irregularity is not illustrated in FIG. 2(c) and so forth.

To form the base layer 203, a vapor phase diffusion method using phosphorous oxychloride can be employed. By heating the substrate at 830 to 950° C. in an atmosphere of phosphorous oxychloride with a gas mixture of nitrogen and oxygen, a phosphorus diffusion layer ($N^+$ layer) is formed, which becomes the base layer. Besides the vapor phase diffusion method, the base layer 203 may be formed by a method in which the substrate is heated after spin-coated or printed with a material containing phosphorus.

After the diffusion layer is formed, glass formed on the surface is removed with hydrofluoric acid or the like. In this manner, the base layer 203 shown in FIG. 2(c) can be formed.

Next, as shown in FIG. 2(d), an antireflection film 201 is formed on the second main surface and a back-surface protective coat 207 is formed on the first main surface. As the antireflection film, a SiNx film, a silicon oxide film, or the like can be utilized. The SiNx film of approximately 100 nm is formed using a plasma CVD apparatus. As the reaction gas, a mixture of monosilane ($SiH_4$) and ammonia ($NH_3$) is often used. Instead of $NH_3$, nitrogen can also be used. Meanwhile, in order to adjust the process pressure, to dilute the reaction gas, and also to promote the bulk passivation effect on the substrate when polycrystalline silicon is used as the substrate, hydrogen may be mixed with the reaction gas in some cases. Although the silicon oxide film can be formed by the CVD method, high characteristics are obtained from the film obtained by a thermal oxidation method. Further, to enhance the effect of protecting the surface, the antireflection film may be formed after an AlO film is formed on the substrate surface in advance.

As the back-surface protective coat 207 on the first main surface also, a SiNx film or a silicon oxide film can be utilized. The film thickness is suitably 50 to 250 nm. As in the case of the second main surface (light receiving surface) side, the SiNx film can be formed by the CVD method, and the silicon oxide film can be formed by the thermal oxidation method or the CVD method. Further, to enhance the effect of protecting the surface, the SiNx film, the silicon oxide film, or the like may be formed after an AlO film is formed on the substrate surface in advance.

Then, as shown in FIG. 2(e), a first collecting electrode 205 is formed on the first conductivity type layer 203 located on the first main surface. Moreover, a second collecting electrode 206 is formed on the second conductivity type layer 204 located on the first main surface. The order of forming the first collecting electrode 205 and the second collecting electrode 206 is not particularly limited. For example, the second collecting electrode 206 may be formed at first. Alternatively, the first collecting electrode 205 and the second collecting electrode 206 may be formed simultaneously. These collecting electrodes (back-surface contact electrodes) can be formed, for example, by a screen printing method. In this case, first, a plate having a parallel line pattern with opening widths of 30 to 100 μm and intervals of 0.6 to 2.0 mm is prepared. Next, this plate is used to print an Ag paste, in which an Ag powder and glass frit are mixed with an organic binder, along the base layer. Likewise, an Ag paste is printed on the back-surface emitter layer. After the Ag paste printing described above, the Ag powder is penetrated through the SiNx film by heating (fire through), so that the electrodes are conductive with silicon. Note that the Ag paste for forming the base layer electrode and the Ag paste for forming the emitter layer electrode can be fired separately. The firing is performed normally at a temperature of 700 to 850° C. for 5 to 30 minutes.

Besides the screen printing method as described above, the electrodes may be formed by a vapor deposition method or a sputtering method.

As described above, a solar cell is manufactured in which the second conductivity type layers having the second conductivity type are continuously formed from the first main surface over the side surface.

Hereinabove, the description has been given of the N-type substrate as an example. In a case of a P-type substrate, the emitter layers can be formed by using, for example, a coating agent containing phosphorus, arsenic, antimony, or the like, while the base layer can be formed by diffusing boron, Al, or the like. In this case also, the effect of enhancing the conversion efficiency is obtained.

The method shown in FIG. 2 can be performed with the following system. Specifically, the present invention further provides a solar cell manufacturing system including: an apparatus configured to form a second conductivity type layer on a first main surface of a semiconductor substrate having a first conductivity type, the second conductivity type layer having a second conductivity type opposite to the first conductivity type; an apparatus configured to form a first conductivity type layer having a conductivity type equal to the first conductivity type on the first main surface; an apparatus configured to form a first collecting electrode on the first conductivity type layer located on the first main surface; and an apparatus configured to form a second collecting electrode on the second conductivity type layer located on the first main surface. In the apparatus configured to form the second conductivity type layer having the second conductivity type, a second conductivity type layer having the second conductivity type is formed on a side surface of the semiconductor substrate and continuously from the second conductivity type layer located on the first main surface to thereby manufacture a solar cell in which the second conductivity type layers having the second conductivity type are continuously formed from the first main surface over the side surface. Such a solar cell manufacturing system is a system that can easily manufacture a solar cell having excellent conversion efficiency and being capable of efficiently collecting carriers.

Moreover, in the apparatus configured to form the second conductivity type layer having the second conductivity type, the second conductivity type layer located on the first main surface and the second conductivity type layer located on the side surface can be formed by a coating-diffusion treatment, the coating-diffusion treatment involving a single coating step and a single diffusion heating step. Such a solar cell manufacturing system can easily form the second conductivity type layers on the first main surface and the side surface. Additionally, by controlling the condition in the coating-diffusion treatment, a desired second conductivity type layer(s) can be easily formed on the first main surface and the side surface.

Further, in the apparatus configured to form the second conductivity type layer having the second conductivity type, the second conductivity type layer located on the first main surface and the second conductivity type layer located on the side surface can be formed by a vapor phase diffusion heating treatment while two semiconductor substrates having the first conductivity type are stacked. Such a solar cell manufacturing system can easily form the second conductivity type layers on the first main surface and the side surface. In addition, by controlling the condition in the vapor phase diffusion heating treatment, a desired second conductivity type layer(s) can be easily formed on the first main surface and the side surface.

The apparatus configured to form the second conductivity type layer includes a heat treatment furnace; a spin coater and a heat treatment furnace. The apparatus configured to form the first conductivity type layer includes a heat treatment furnace; for coating and diffusion, a spin coater and a heat treatment furnace, as well as a screen printer and a heat treatment furnace. The apparatuses configured to form the first collecting electrode and the second collecting electrode include, besides a screen printer and a firing furnace, an evaporator and a sputtering apparatus.

EXAMPLES

Hereinafter, the present invention will be more specifically described by showing Example and Comparative Example, but the present invention is not limited to the following Example.

To check the validity of the present invention, solar cell characteristics were compared.

Example

From ten phosphorus-doped {100} N-type as-cut silicon substrates each having a thickness of 200 μm and a specific resistance of 1 Ω·cm, damage layers were removed using a hot concentrated potassium hydroxide aqueous solution. Then, each substrate was immersed in an aqueous solution of potassium hydroxide/2-propanol at 72° C. to form texture. Subsequently, the substrate was cleaned in a mixture solution of hydrochloric acid/hydrogen peroxide heated to 75° C.

Thereafter, the back surface was spin-coated with a coating agent of an aqueous solution containing 2% boric acid and 2% polyvinyl alcohol. By setting the number of spinning rotations to 1000 rotations per minute, the coating agent was spread and formed at a portion approximately 1 mm from the outer peripheral portion of the light receiving surface. The substrate coated with the coating agent was heated in a nitrogen atmosphere at 1000° C. for 18 minutes. Thereby, a back-surface emitter layer, a side-surface emitter layer, and a light-receiving-surface emitter layer were continuously formed. As a result of the measurement by a four-point probe method, the emitter layers had a sheet resistance of 50Ω.

After the heat treatment, the substrate was thermally oxidized at 1000° C. for 3 hours in an oxygen atmosphere to form a mask. Further, the back surface of this substrate was opened using a phosphoric acid-based etching paste by the screen printing method at intervals of 1.2 mm (the oxide film was partially etched). The substrate was immersed in KOH at 80° C. to remove the emitter layer at the opening parts.

Next, in a phosphorous oxychloride atmosphere, the substrates were heated at 870° C. for 40 minutes while the light receiving surfaces were stacked on each other, so that phosphorus diffusion layers were formed as base layers in the opening parts. Thereafter, the resultant was immersed in hydrofluoric acid at a concentration of 12% to remove glass on the surface.

After the above treatments, SiNx films were formed on both surfaces using a plasma CVD apparatus. The film thicknesses on both the light receiving surface and the back surface were 100 nm.

Next, an Ag paste was printed on each base layer and back-surface emitter layer and then dried. The resultant was fired in an air atmosphere at 780° C. Thereby, a base electrode and an emitter electrode were formed.

Comparative Example

A solar cell was prepared in the same manner as in Example, except that when the back surface was spin-coated with the coating agent of an aqueous solution containing boric acid and polyvinyl alcohol, the number of spinning rotations was set to 4000 rotations per minute. In Comparative Example, no coating agent spread on the light receiving surface and the side surface was observed in the spin coating event. Hence, the emitter layer was formed only on the back surface.

Under pseudo-sunlight, the current-voltage characteristics were measured. Table 1 below shows average values under various conditions.

TABLE 1

|  | Short circuit current (mA/cm$^2$) | Open-circuit voltage (V) | Fill factor (%) | Photoelectric conversion efficiency (%) |
| --- | --- | --- | --- | --- |
| Comparative Example | 40.1 | 0.670 | 79.2 | 21.3 |
| Example | 40.4 | 0.672 | 79.1 | 21.5 |

In Example, the side-surface emitter layer and the light-receiving-surface emitter layer were formed. Thus, the efficiency of collecting carriers generated in the outer peripheral portion of the light receiving surface was enhanced, and an increase in the short circuit current was found. Further, since the emitter range on the light receiving surface was small, no decrease in the fill factor was recognized. As a result, the conversion efficiency was improved. On the other hand, in Comparative Example, the side-surface emitter layer and the light-receiving-surface emitter layer were not formed. Hence, the efficiency of collecting carriers generated in the outer peripheral portion of the light receiving surface was decreased, and the conversion efficiency was decreased.

It is to be noted that the present invention is not restricted to the foregoing embodiments. The embodiments are just examples, and any examples that have substantially the same feature and demonstrate the same functions and effects as those in the technical concept described in claims of the present invention are included in the technical scope of the present invention.

The invention claimed is:

1. A solar cell comprising:
a semiconductor substrate having a first conductivity type, the semiconductor substrate having a first main surface, a second main surface and a side surface, the side surface being at an outer edge of the semiconductor substrate, the first main surface and the second main surface are parallel, and the second main surface is a light receiving surface;
a first conductivity type layer having a conductivity type equal to the first conductivity type;
two second conductivity type layers formed continuously from each other, wherein
each second conductivity type layer of the two second conductivity type layers has a second conductivity type opposite to the first conductivity type, and the two second conductivity type layers formed continuously from each other are:
a lower second conductivity type layer on and extending along the first main surface, and
a side second conductivity type layer that is on and extends along only a part of the side surface that is at the outer edge of the semiconductor substrate and the side second conductivity type layer does not reach to the second main surface;
a first collecting electrode on the first conductivity type layer located on the first main surface; and
a second collecting electrode on the lower second conductivity type layer located on the first main surface.

2. A solar cell comprising:
a semiconductor substrate having a first conductivity type, the semiconductor substrate having a first main surface, a second main surface and a side surface, the side surface being at an outer edge of the semiconductor substrate between an end of the first main surface and an end of the second main surface, the first main surface and the second main surface are parallel;
a first conductivity type layer having a conductivity type equal to the first conductivity type;
three second conductivity type layers formed continuously from each other, wherein
each second conductivity type layer of the three second conductivity type layers has a second conductivity type opposite to the first conductivity type, and
the three second conductivity type layers formed continuously from each other are:
a lower second conductivity type layer on and extending along the first main surface,
a middle second conductivity type layer on and extending along the side surface, and
an upper second conductivity type layer that is on and extends along only an outer peripheral portion of the second main surface;
a first collecting electrode on the first conductivity type layer located on the first main surface; and
a second collecting electrode on the lower second conductivity type layer located on the first main surface.

3. The solar cell according to claim 1, wherein an electrode located closest to an outermost peripheral end of the first main surface is the second collecting electrode.

4. The solar cell according to claim 2, wherein an electrode located closest to an outermost peripheral end of the first main surface is the second collecting electrode.

5. A method for manufacturing a solar cell, comprising the steps of:
providing a semiconductor substrate having a first conductivity type, the semiconductor substrate having a first main surface, a second main surface and a side surface, the side surface being at an outer edge of the semiconductor substrate, the first main surface and the second main surface are parallel, and the second main surface is a light receiving surface;
forming two second conductivity type layers continuously from each other where each second conductivity type layer of the two second conductivity type layers has a second conductivity type opposite to the first conductivity type, the two second conductivity type layers being formed continuously from each other are:
a lower second conductivity type layer on and extending along the first main surface, and
a side second conductivity type layer that is on and extends along only a part of the side surface that is at the outer edge of the semiconductor substrate and the side second conductivity type layer does not reach to the second main surface;

forming a first conductivity type layer having a conductivity type equal to the first conductivity type on the first main surface;

forming a first collecting electrode on the first conductivity type layer located on the first main surface; and forming a second collecting electrode on the lower second conductivity type layer located on the first main surface.

6. The method for manufacturing a solar cell according to claim 5, wherein in the step of forming the two second conductivity type layers, the lower second conductivity type layer and the side second conductivity type layer are formed by a coating-diffusion treatment, and the coating-diffusion treatment consists of a single coating step and a single diffusion heating step.

7. The method for manufacturing a solar cell according to claim 5, wherein, in the step of forming the two second conductivity type layers, the lower second conductivity type layer and the side second conductivity type layer are formed by a vapor phase diffusion heating treatment while two semiconductor substrates having the first conductivity type are stacked.

8. A method for manufacturing a solar cell, comprising the steps of:

providing a semiconductor substrate having a first conductivity type, the semiconductor substrate having a first main surface, a second main surface and a side surface, the side surface being at an outer edge of the semiconductor substrate between an end of the first main surface and an end of the second main surface, the first main surface and the second main surface are parallel;

forming three second conductivity type layers continuously from each other where each second conductivity type layer of the three second conductivity type layers has a second conductivity type opposite to the first conductivity type, the three second conductivity type layers being formed continuously from each other are:

a lower second conductivity type layer on and extending along the first main surface, a middle second conductivity type layer on and extending along the side surface, and an upper second conductivity type layer that is on and extends along only an outer peripheral portion of the second main surface;

forming a first conductivity type layer having a conductivity type equal to the first conductivity type on the first main surface;

forming a first collecting electrode on the first conductivity type layer located on the first main surface; and forming a second collecting electrode on the lower second conductivity type layer located on the first main surface.

9. The method for manufacturing a solar cell according to claim 8, wherein in the step of forming the three second conductivity type layers, the lower second conductivity type layer and the middle second conductivity type layer are formed by a coating-diffusion treatment, and the coating-diffusion treatment consists of a single coating step and a single diffusion heating step.

10. The method for manufacturing a solar cell according to claim 8, wherein, in the step of forming the three second conductivity type layers, the lower second conductivity type layer and the middle second conductivity type layer are formed by a vapor phase diffusion heating treatment while two semiconductor substrates having the first conductivity type are stacked.

* * * * *